United States Patent
Mahawili

(10) Patent No.: US 11,931,682 B2
(45) Date of Patent: Mar. 19, 2024

(54) WASTE GAS ABATEMENT TECHNOLOGY FOR SEMICONDUCTOR PROCESSING

(71) Applicant: EDWARDS VACUUM LLC, Sanborn, NY (US)

(72) Inventor: Imad Mahawili, Roseville, CA (US)

(73) Assignee: Edwards Vacuum LLC, Sandborn, NY (US)

( * ) Notice: Subject to any disclaimer, the term of this patent is extended or adjusted under 35 U.S.C. 154(b) by 109 days.

(21) Appl. No.: 17/405,270

(22) Filed: Aug. 18, 2021

(65) Prior Publication Data
US 2022/0088529 A1   Mar. 24, 2022

Related U.S. Application Data

(60) Provisional application No. 63/081,478, filed on Sep. 22, 2020.

(51) Int. Cl.
*H01J 37/32* (2006.01)
*B01D 47/02* (2006.01)
(Continued)

(52) U.S. Cl.
CPC .......... *B01D 47/021* (2013.01); *B01D 47/10* (2013.01); *B01D 50/00* (2013.01); *B01D 53/007* (2013.01);
(Continued)

(58) Field of Classification Search
None
See application file for complete search history.

(56) References Cited

U.S. PATENT DOCUMENTS

| 4,211,249 A | 7/1980 | Richards |
| 5,427,610 A | 6/1995 | Croker |

(Continued)

FOREIGN PATENT DOCUMENTS

| CN | 2633410 Y | 8/2004 | |
| CN | 103372368 A | * 10/2013 | ............. Y02C 20/30 |

(Continued)

OTHER PUBLICATIONS

KR102043819B1_ENG (Espacenet machine translation of Jeong) (Year: 2019).*
(Continued)

*Primary Examiner* — Gabriel E Gitman
(74) *Attorney, Agent, or Firm* — Gardner, Linn, Burkhart & Ondersma LLP

(57) ABSTRACT

A semiconductor waste abatement system for a semiconductor processing system includes a vacuum pump, an abatement apparatus having an abatement chamber in fluid communication with a source of semiconductor waste gas from the semiconductor processing chamber, and with the abatement chamber configured to ionize the waste gas and to exhaust ionized gas. The abatement system further includes a filter apparatus with a filter chamber, which forms a liquid reservoir. The inlet of the filter apparatus is in fluid communication with the outlet of the abatement chamber and the liquid reservoir, and the outlet of the filter apparatus is in communication with the inlet of the vacuum pump, wherein the filter chamber is under a vacuum, and wherein semiconductor waste gas is ionized in the abatement chamber and then filtered by the filter apparatus prior to input to the vacuum pump.

13 Claims, 10 Drawing Sheets

(51) Int. Cl.
   *B01D 47/10*     (2006.01)
   *B01D 50/00*     (2022.01)
   *B01D 53/00*     (2006.01)
   *B01D 53/32*     (2006.01)
   *B01D 53/75*     (2006.01)
   *B08B 9/032*     (2006.01)
   *C23C 16/44*     (2006.01)
   *H05H 1/46*      (2006.01)

(52) U.S. Cl.
   CPC ............ *B01D 53/32* (2013.01); *B08B 9/0321* (2013.01); *C23C 16/4412* (2013.01); *H01J 37/32844* (2013.01); *B01D 53/005* (2013.01); *B01D 2259/80* (2013.01); *B01D 2259/818* (2013.01); *H05H 1/4652* (2021.05); *H05H 2245/17* (2021.05); *Y10S 55/30* (2013.01)

(56) References Cited

U.S. PATENT DOCUMENTS

| | | |
|---|---|---|
| 5,616,208 A | 4/1997 | Lee |
| 5,759,237 A | 6/1998 | Li et al. |
| 6,039,060 A | 3/2000 | Rower |
| 6,325,361 B1 | 12/2001 | Van Duijn |
| 6,370,911 B1 | 4/2002 | Zhou et al. |
| 6,673,323 B1 | 1/2004 | Bhatnagar et al. |
| 10,302,553 B2 | 5/2019 | Siladie et al. |
| 10,685,818 B2 | 6/2020 | Dickinson |
| 2001/0024887 A1 | 9/2001 | Graves et al. |
| 2001/0048902 A1 | 12/2001 | Hertzler et al. |
| 2004/0001787 A1* | 1/2004 | Porshnev ............... B01D 53/68 423/210 |
| 2006/0107838 A1 | 5/2006 | Meier et al. |
| 2008/0276801 A1 | 11/2008 | Bell et al. |
| 2010/0071548 A1 | 3/2010 | Smith |
| 2010/0155222 A1 | 6/2010 | Rostaing et al. |
| 2011/0089017 A1* | 4/2011 | Hur ....................... B01D 53/32 422/186 |
| 2011/0135552 A1 | 6/2011 | Dickinson et al. |
| 2016/0166868 A1 | 6/2016 | Dickinson |
| 2019/0282948 A1 | 9/2019 | Mahawili |
| 2020/0291524 A1 | 9/2020 | Zong |

FOREIGN PATENT DOCUMENTS

| | | | |
|---|---|---|---|
| CN | 110170217 A * | 8/2019 | ........... B01D 47/021 |
| FR | 2886866 A1 * | 12/2006 | ........... B01D 53/323 |
| KR | 100710009 B1 * | 4/2007 | ........ H01J 37/32844 |
| KR | 20090056353 A | 6/2009 | |
| KR | 20100126167 A | 12/2010 | |
| KR | 102043819 B1 * | 11/2019 | ........... B01D 47/021 |
| TW | 201125632 A | 8/2011 | |
| WO | 2017132186 A1 | 8/2017 | |
| WO | 2018080885 A1 | 5/2018 | |
| WO | 2020247708 A1 | 12/2020 | |

OTHER PUBLICATIONS

CN110170217A_ENG (Espacenet machine translation of Gao) (Year: 2019).*
KR100710009B1_ENG (Espacenet machine translation of Seo) (Year: 2007).*
FR2886866A1_ENG (Espacenet machine translation of Larquet) (Year: 2006).*
CN103372368A-preview (IP.com machine translation of Zhang) (Year: 2013).*
International Search Report and Written Opinion of the International Searching Authority of International Application No. PCT/US2021/050775 dated Dec. 10, 2021.

* cited by examiner

WASTE GAS ABATEMENT TECHNOLOGY FOR SEMICONDUCTOR PROCESSING

BACKGROUND

In general, the fabrication of semiconductor devices employs the conversion of certain chemicals to form the desired thin films that make up the circuit layers of semiconductor devices. For example, in a chemical vapor deposition (CVD) process silicon dioxide thin film deposited on a silicon wafer is formed by the oxidation of silane with oxygen at a wafer temperature of approximately 400 degrees centigrade and at processing chamber pressure of around 300 mTorr. Silicon dioxide thin films are also deposited by the oxidation of vapor tetraethysiloxane, TOES, with oxygen and ozone at nearly similar processing conditions. Silicon oxide films are also deposited at lower temperatures using low-pressure gas phase plasma enhancement (PECVD). In another process, silane is reacted with ammonia to form silicon nitride at low pressures and moderate wafer temperatures. In these and nearly all other CVD reactions, such as the formation of tungsten and tungsten silicide thin films, nearly 75% of the gaseous feed reactants into the processing chamber pass through the process chamber unconverted.

Similarly, in semiconductor device fabrication reactive gases are used to etch vias off the patterned wafers under low pressure plasma conditions to create electrical conducting pathways on the device wafer. The etched materials are gaseous under typical etch process pressures and temperatures. For example, carbon tetrafluoride gas, and other perfluoro carbon gases (PFC) such as C2F6, SF6 and others, are used to etch silicone off the device wafer. The reaction byproducts of such etching reaction with silicon is silicon tetrafluoride which is a gas under typical etching processes. The etching volatile byproducts together with the unconsumed carbon tetrafluoride form the typical waste gas of such semiconductor etch processes.

Both CVD and Etch process waste gas streams need to be abated. Some existing abatement technologies employ high temperature flame using the combustion of methane with air or oxygen to abate, destroy, these waste chemicals. Others use electric arc discharge for such abatement. Both of these technologies are used at one atmosphere pressure in systems installed post the semiconductor processing vacuum pump. Large amounts of nitrogen, in the range from 30-500 liters per minute, or greater, are used in both CVD or Etch process to effect safe one atmospheric gas flows of some flammable waste gases. Consequently, the amount of energy used in post pump abatement systems consume a substantial amount of energy to achieve acceptable destruction rate efficiencies (DRE) for most waste gases. Higher energies are typically used to achieve high DRE of PFC abatements for environmental protection.

It would be most ideal and preferable to abate waste gases before the vacuum pump of a semiconductor process system. This would eliminate the addition of substantial flow rates of nitrogen which would significantly reduce the amount of energy needed for achieving high DRE for both CVD and Etch process waste gases.

In general, the byproducts of abatement technologies whether they are pre or post vacuum pump include mixtures of permanent gases such as nitrogen, oxygen, nitrogen oxides, carbon oxides, inorganic acid gases (such as hydrofluoric and hydrochloric acids), water vapor, and solids such as silicon dioxide, titanium dioxide, tungsten oxides, carbon and other organic polymers. In a post vacuum pump abatement system these waste byproducts are then separated using water scrubbers to remove acid gases and solids. However, in pre-vacuum pump abatement all these abatement byproducts end up in the vacuum pump causing high pump maintenance and pump failures. Pre-pump CVD abatement is not typically performed in the semiconductor industry due to the exceptionally large amounts of solids that would be generated, which could damage the pump, and thus rendering it unusable technology. While there are one or two commercially available pre-pump Etch abatement systems for abating PFC's with moderate particles generation, they generate enough particles to impede the performance of the vacuum pump, as a result require costly frequent maintenance. These Pre-pump abatement systems also plug from within due to the accumulation of solids byproducts and consequently have limited commercial use in the semiconductor industry

SUMMARY

Accordingly, the present disclosure describes a novel pre-pump abatement system for both CVD and Etch processes without the attendant limitations of prior pre-pump abatement systems.

In one embodiment, a semiconductor waste abatement system includes: a pump having a pump inlet and a pump outlet; an abatement apparatus having an abatement chamber including an inlet and an outlet, the inlet adapted for fluid communication with a source of semiconductor waste gas, and the abatement chamber configured to energize the waste gas to ionize the waste gas and to exhaust ionized gas at the output; and a filter apparatus to filter particles in the ionized waste gas. The filter apparatus includes a filter chamber, an inlet, and an outlet. The filter chamber forms a liquid reservoir, and the inlet of the filter apparatus is in fluid communication with the outlet of the abatement chamber and the liquid reservoir. The outlet of the filter apparatus is in communication with the pump inlet, wherein the semiconductor waste gas is ionized and then filtered prior to input to the pump.

In another embodiment, the abatement apparatus is configured to ionize the semiconductor waste gas into a plasma. For example, the abatement apparatus may be configured to generate an electromagnetic field to ionize the semiconductor waste gas into the plasma.

In any above, the filter apparatus further includes a feed tube, with a venturi restriction therein and a venturi inlet to draw in the process gas or the filter liquid into the filter apparatus. For example, the feed tube may comprise a perforated feed tube.

In any of the above, the filter apparatus includes a filter liquid control system for controlling the filter liquid flow into and out of the liquid reservoir, and optionally the filter liquid control system is configured to maintain the filter liquid at a liquid height in the liquid reservoir.

In one embodiment, the filter liquid control system includes a pump to pump filter liquid into the liquid reservoir.

In any of the above claim, the filter chamber includes a rotating member to rotate the filter fluid in the chamber.

In another embodiment, a semiconductor waste abatement apparatus, with a waste gas inlet and an outlet, includes an abatement chamber with an outer tube, which is configured to ionize the waste gas in the outer tube. The outer tube has an inlet that forms or is adapted to provide fluid communication with the waste gas inlet of the semiconductor waste abatement apparatus. The abatement chamber further has an inner tube spaced inwardly of the outer tube to define a space there between and inwardly of the waste gas inlet, which has an inner wall, an inlet, and an outlet, where the outlet of the inner tube is adapted for fluid communication with the outlet of the semiconductor waste abatement apparatus. The semiconductor waste abatement apparatus also includes a fluid recirculating circuit circulating fluid from the outlet of the inner tube to the space between the outer tube and the inner tube wherein recirculated fluid flows to the inlet of the inner tube to wet the inner wall of the inner tube to remove particles that may be deposited on the inner wall when the semiconductor waste abatement apparatus is used to abate waste gas from a semiconductor processing chamber.

In one embodiment, the semiconductor waste abatement apparatus further includes a coil adapted to generate an electromagnetic field to ionize the semiconductor waste gas into a plasma. For example, the coil includes a plurality of loops, with the inner tube spaced from a lowermost loop of the plurality of loops.

In any of the above, the inner tube comprises a first inner tube. The semiconductor waste abatement apparatus further includes a second inner tube in fluid communication with first inner tube, with the second inner tube having an inlet and forming or being adapted for fluid communication with the outlet of the semiconductor waste abatement apparatus.

In one form, the inlet of the second inner tube is spaced below the outlet of the first inner tube, and the recirculating circuit recirculates fluid from below the inlet of the second inner tube and flows the recirculated fluid into the space between the first inner tube and the outer tube below the inlet of the first inner tube.

In any of the above, the semiconductor waste abatement apparatus further includes a base with a fluid chamber. The outer tube extends into the base, and the first inner tube extends from the fluid chamber of the outer tube into the fluid chamber in the base.

In any of the above, the semiconductor waste abatement apparatus may be combined with a fluid filter, which has an input in fluid communication with the output of the semiconductor waste abatement apparatus.

In one embodiment, the fluid filter may be configured to provide make up fluid to the fluid recirculating circuit.

DETAILED DESCRIPTION OF THE DRAWINGS

DETAILED DESCRIPTION

Figure 1:
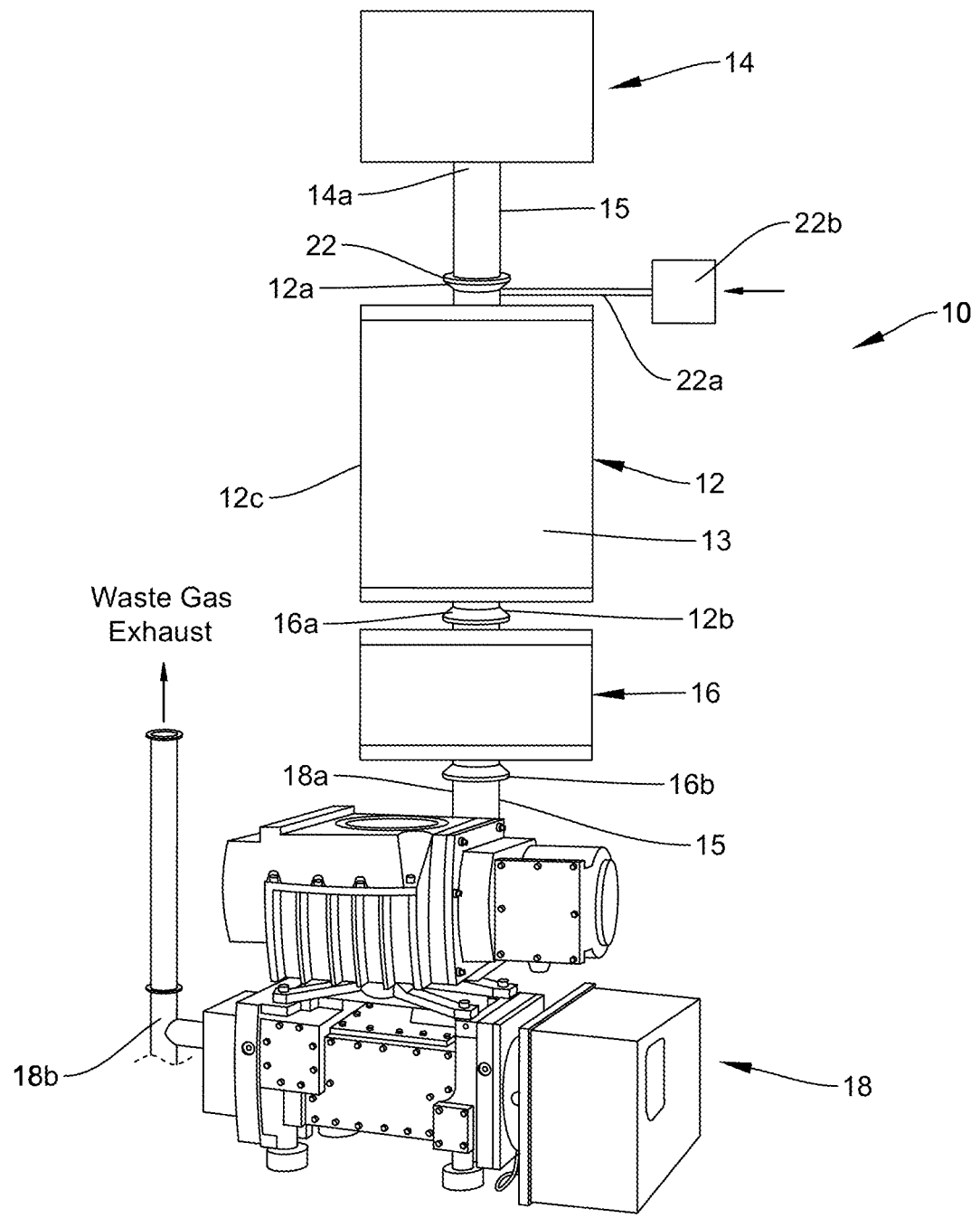
FIG. 1 is a schematic of a process waste abatement system for semiconductor processing.

Referring to FIG. 1, the numeral 10 generally refers to a semiconductor process waste abatement system that includes an abatement apparatus 12, which is in fluid communication with an output 14*a* of a semiconductor processing chamber 14, a filter apparatus 16, and a pump 18 from which waste gas is exhausted. As will be more fully described below, abatement apparatus 12 may be located between the semiconductor processing chamber 14 and the pump 18 to abate the waste gases before the waste gases flow into the pump and remove the solids in the waste gases using filter apparatus 16, which can reduce, if not eliminate, the addition of substantial flow rate of nitrogen. Therefore, system 10 may significantly reduce the amount of energy needed for achieving high destruction rate efficiencies (DRE) for both chemical vapor deposition (CVD) and etching (Etch) process waste gases.

Referring again to FIG. 1, abatement apparatus 12 includes a chamber 13 with an inlet 12*a* that is in fluid communication with the output 14*a* of semiconductor processing chamber 14 and an outlet 12*b* that is in fluid communication with the inlet 16*a* of filter apparatus 16, which will be more fully described below. Similarly, in the illustrated embodiment, outlet 16*b* of filter apparatus 16 is in fluid communication with the inlet 18*a* of pump 18 from which waste gas is exhausted through an exhaust outlet 18*b*. As will be more fully described below, chamber 13 is configured as an abatement chamber.

In the illustrated embodiment, abatement apparatus 12 is configured to be located in the fore-line 15 (the section of the conduit that connects the semiconductor process chamber and the vacuum pump) (which may include one or more valves to control the flow of the waste gases, which are controlled by control system 150 described below) to the pump; however, it should be understood that it may be located after the pump. The pump may be conventional vacuum pump; therefore, abatement apparatus 12 and filter 16 operate under vacuum pressure.

Figure 2:
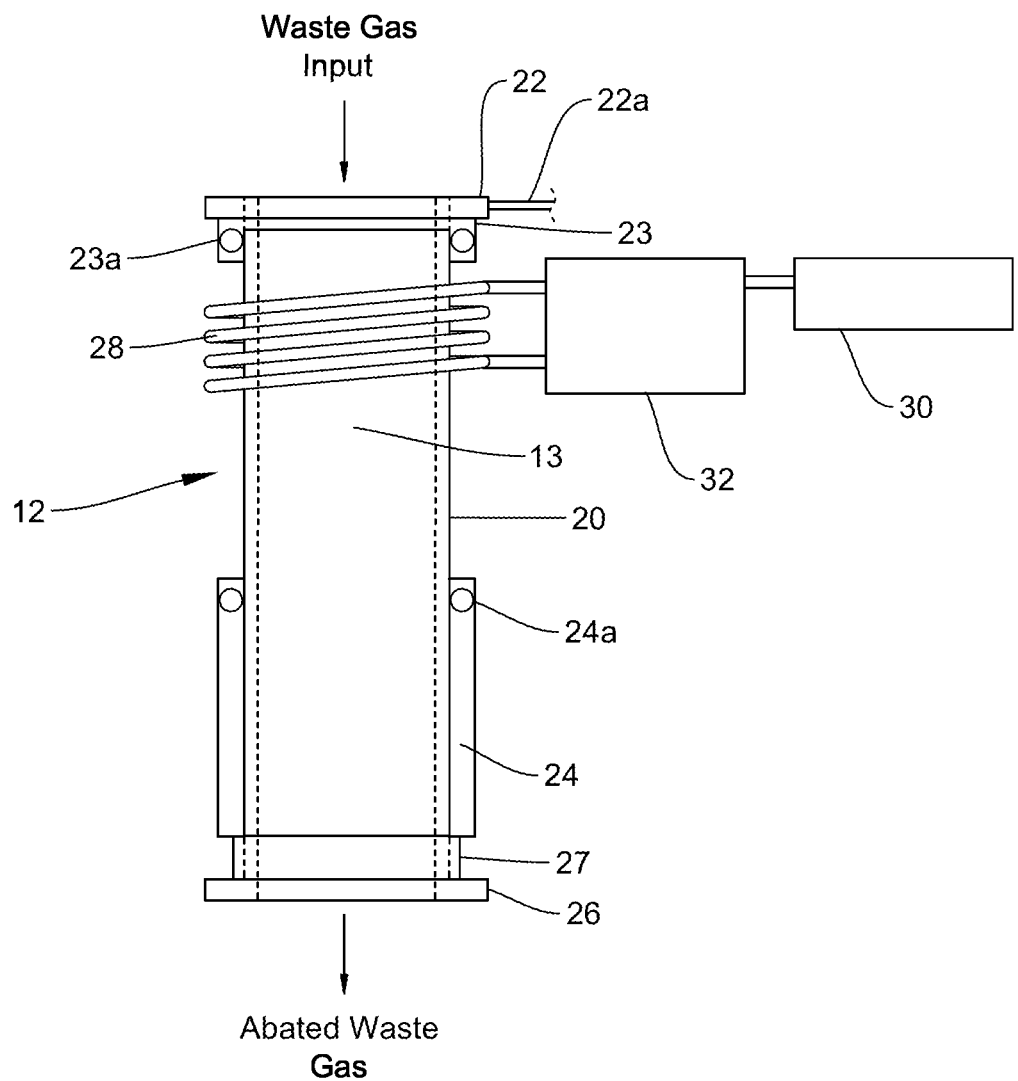
FIG. 2 is a partial fragmentary elevation view of a pre-pump abatement apparatus of the process waste abatement system of FIG. 1.
Figure 3:
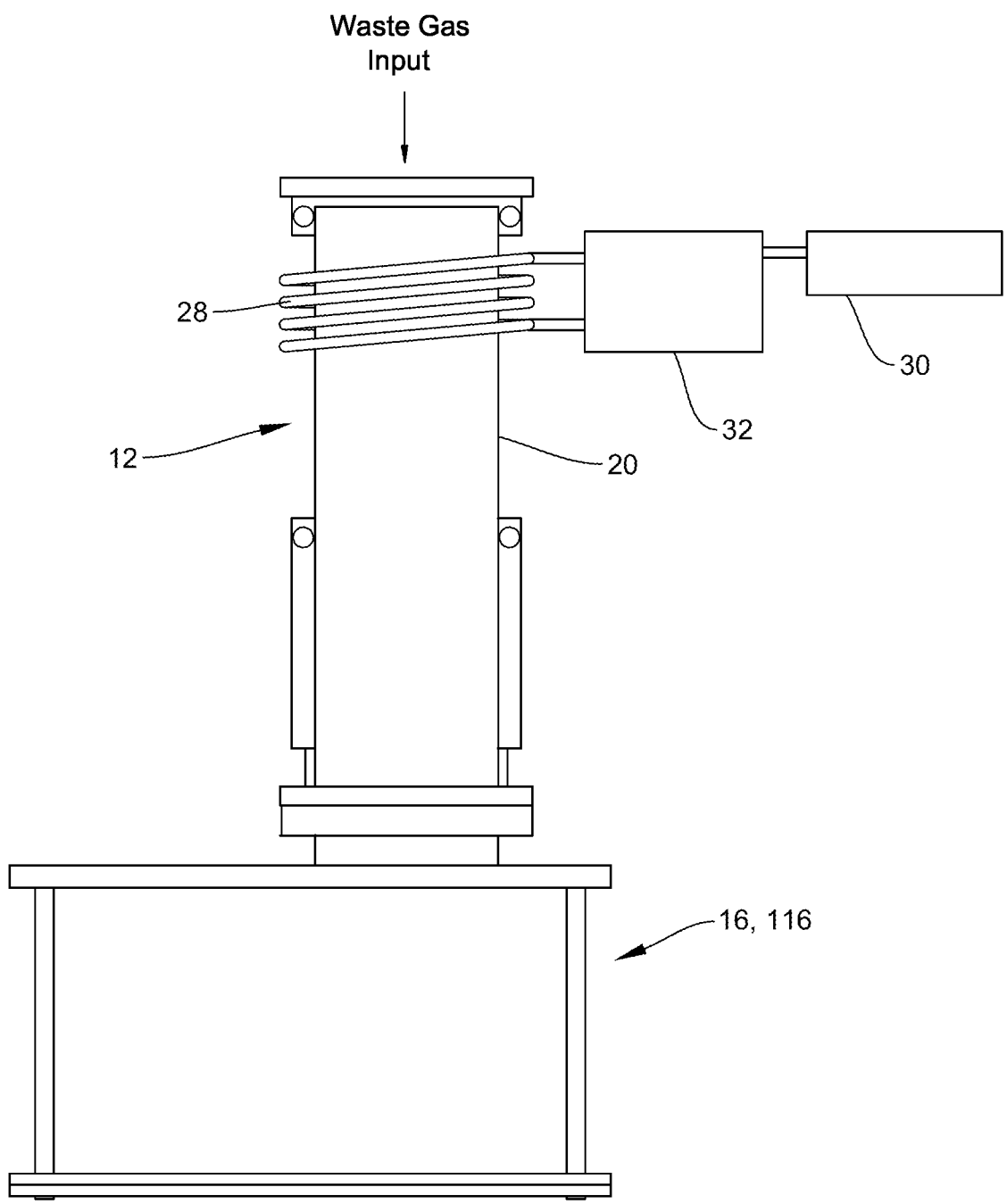
FIG. 3 is a partial fragmentary elevation view of a pre-pump abatement apparatus and of one embodiment of a fluid filter apparatus of the process waste abatement system of FIG. 1.

Referring to FIG. 2, as noted above, chamber 13 is configured as an abatement chamber. Chamber 13 may include an outer tube 20, such as a cylindrical outer tube whose nominal diameter can vary, for example, from about 0.5 inch to about 12 inches or larger. For most CVD or Etch abatement applications, the tube's 20 nominal diameter can vary, for example, from about 2 inch to about 4 inch, for example. However, the larger the diameter of this abatement tube the longer the period between maintenance in-gases with high particle content and generation. Suitable material for the abatement tube material has a high dielectric constant, for example quartz or alumina. Quartz tubes are especially suitable when hydrogen fluoride is not present in the processing gas or the abatement byproducts. Whereas alumina may be more suitable when there is hydrogen fluoride present in the processing gas and the abatement byproducts.

Mounted or formed at the upper end of the chamber 13 is a first flange 22. Flange 22 includes a downwardly depending annular rim 23 for receipt of the top of tube 20 therein, which supports an annular seal 23a, such as an O-ring seal, which sealingly engages the outer surface of tube 20, as shown. Flange 22 forms the outlet 12b of chamber 13 and provides a connection for the abatement apparatus 12 to the fore-line 15 (FIG. 1) of the abatement processing system. Flange 22 may also include one or more inlets 22a (FIGS. 1 and 2) for introducing other gases, as described below.

Referring to FIG. 2, abatement apparatus 12 also includes an annular base 24 into which tube 20 is inserted, which also supports an annular seal 24a, such as an O-ring seal, which sealingly engages the outer surface of tube 20, as shown. Mounted to the lower end of tube 20 below base 24 is a second flange 26 with an upwardly extending annular rim 27, which receives the lower end of tube 20 therein, with flange 26 forming the outlet of the chamber 13 and providing a sealed connection to filter apparatus 16, described more fully below.

The abatement of the waste gases in chamber 13 is achieved by energizing the waste gases to ionizing the waste gases in the abatement chamber to a high temperature in a range of about 350 C to about 10,000 C or higher. For example, the waste gases may be heated to a temperature in range of about 350 C to 1100 C to ionize the waste gases, for example, using heating coils or high temperature tungsten halogen lamps or coils that generate a magnetic field, or ionized into a plasma to a temperature in a range of about 3,000 C to 10,000 C or higher. The plasma may be created by a strong electromagnetic field where the ionized gas substances become increasing electrically conductive thus creating an ionizing plasma field within the abatement tube.

In the illustrated embodiment, the strong electromagnetic field may be generated using a coil 28 and a high radio frequency generator 30, which is connect to the coil 28, optionally via a matching network 32, described below, and which is tuned to a selected radio frequency. As shown, the coil 28 may be located around the upper end of tube 20 below flange 22 so that the electromagnetic field is generated at the upper end of tube 20. The range of radio frequencies of the RF generator 30 may vary considerably, for example, from kHz to MHz and microwave can be used. For abatement of typical CVD and Etch waste gas streams, a frequency between 1 MHz-20 MHz, and for example 2 MHz, 28.2 MHz or 13.56 MHz, are suitable as they are commercially readily available, but other frequencies may be used. Thus, abatement apparatus 12 may generate an inductively coupled ionizing plasma field within the tube 20.

The coil 28 is typically made of a thermally and electrically conducting metal and copper rod is commonly employed and is wound around tube 20. At high RF power, for example above, 2 kW, the copper coil is made of copper tube to allow the flow of cooling water or air through it so that it can be water cooled or air cooled.

The number of turns of the coil about tube 20 can be optimized for highest power transfer efficiencies based on the actual radio frequency (RF) power supply, tube geometry and specific carrier gases and abatement chemistries. However, in general for CVD and Etch abatement the number of turns is typically in the range of 3 to 7 turns. The RF power transfer may be further optimized by inserting a variable electrical impedance matching network 32 of dynamically variable capacitance. Again, RF generators and matching networks are commercially available and are selected based on the power needed to achieve maximum destruction rate efficiencies (DRE) for a given process abatement requirements.

The RF excitation of the process waste gases may not be enough to achieve high levels of destruction rate efficiencies (DRE). Additional gases may, therefore, need to be added to the waste gas stream before the coil so that they can react irreversibly within the plasma field achieving complete destruction rate efficiencies (DRE) goals.

For example, in an Etch process abating perfluorocompounds, such perfluoro carbons (PFCs), including CF4, C2F6 and others, water vapor or hydrogen and/or oxygen gases can be introduced into the waste gas stream at inlet 22a via valve 22b, described below. This allows for the ionization of the water to produce hydrogen and oxygen ions that combine with the free fluorine ions generated within the plasma field from the C2F6 and form HF and thus suppress the formation of CF4 by re-association.

In any of the embodiments described herein, a novel abatement process for achieving DRE efficiencies of greater than 96% of CF4 and other PFCs using this plasma abatement system with fluid filter is to introduce hydrogen and oxygen at an optimal ratio to the volumetric flow rate of the PFCs in the gas phase. This ratio of CF4:H2:O2 could be in the range of 1:0.5:0.25 to 1:1:0.5 and other ratios depending on the RF power. The highest DRE of PFCs in this apparatus can up to and including 100% be achieved using a 13.56 MHz RF power in the range of 1500 to 4500 Watts and optimally at 3000 Watts for stoichiometric ratios at vacuum at pressures in range of 100-to-1500 mTorr and optimally at 850 mTorr. The flow rate of the reactive gas into the waste gas may be varied, as noted, to stabilize the plasma.

The injection of reactive hydrogen and oxygen gases at a preset molar ratio into the PFC/diluted with N2 or Ar gas is readily achieved and is the most efficient kinetic path for the destruction of CF4 and all other PFCs. However, the piping and feeding of hydrogen gas must be installed with strict safety controls and regulation. An off-the-shelf hydrogen generator may be used to resolve this safety issue. Optionally a hydrogen and/or oxygen generator may be used. Hydrogen production can be produced at the desired flow rate and pressure by using, for example, an HGH-300E water electrolyzer hydrogen generator which can on demand produce hydrogen up to 500 cubic centimeter per minute at a purity of 99.999%. This novel integration of a hydrogen generator or a hydrogen and/or oxygen generator into this RF abatement system enables the achievement of the highest DRE of CF4 and other PFCs without the limitation of safety restrictions on the piping or storage of hydrogen gas.

Figure 1A:
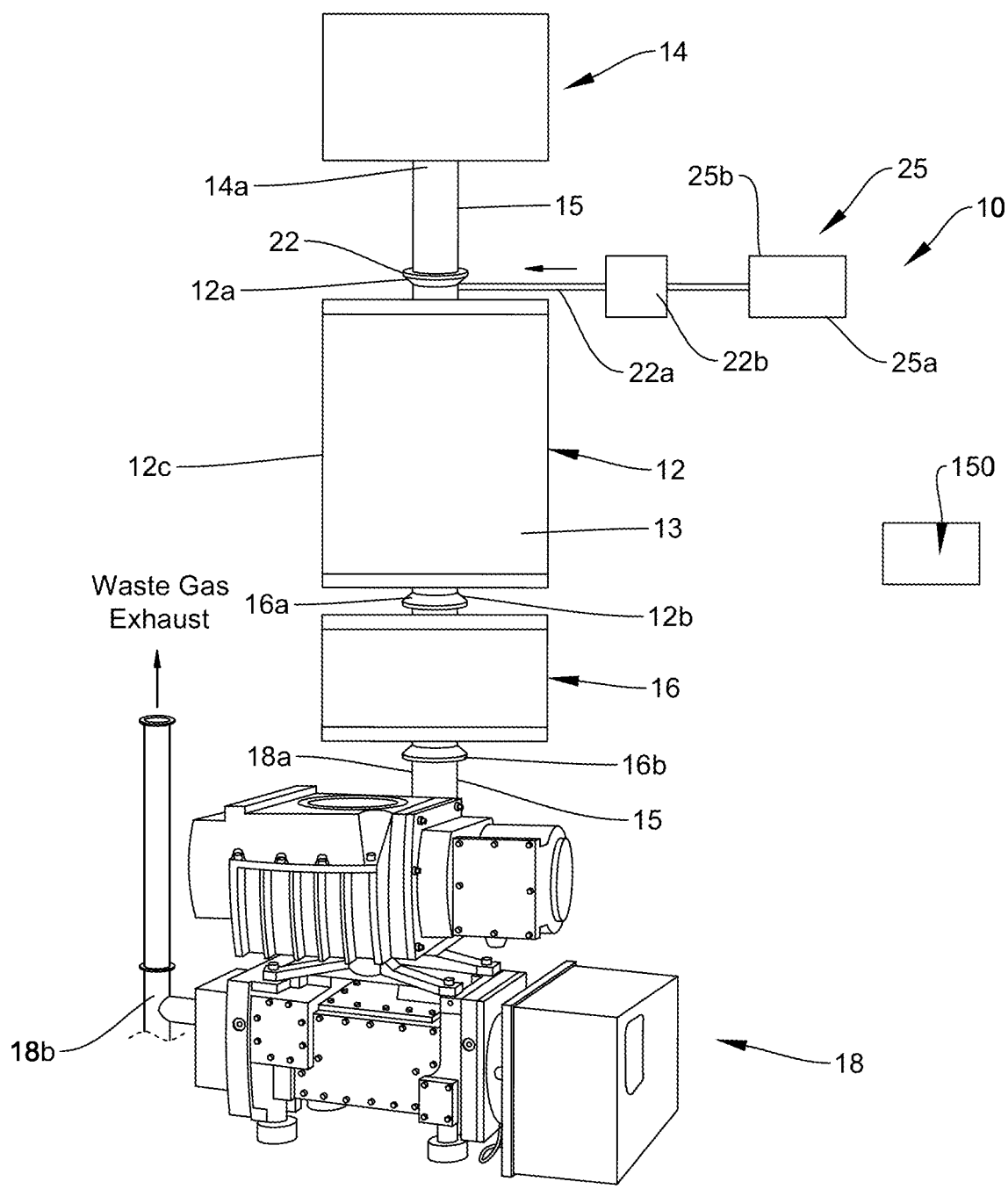
FIG. 1A is a schematic of a process waste abatement system for semiconductor processing similar to FIG. 1 with a generator provided as a source of hydrogen and/or oxygen to the abatement system.

Referring to FIG. 1A, as noted, semiconductor process waste abatement system 10 may include a source 25 of one or more additive or reactive gases, as noted, such as hydrogen or oxygen, which may be introduced into apparatus 12 through inlet or inlets 22a, whose flow may be controlled, for example, by one or more valves 22b and control system 150, noted below. For example, source 25 may include a hydrogen generator 25a, such as an HGH-300E water electrolyzer hydrogen generator (or a hydrogen and oxygen generator noted above) that generates hydrogen gas. Generator 25a includes an outlet 25b from which the generator outputs a source of hydrogen gas that is directed into inlet 22a of abatement apparatus 12 via valve 22b. The flow rate and pressure of the hydrogen gas output at outlet 25b may be controlled, for example, using control system 150 (described below), which may be in communication with and controls generator 25a and/or valve 25b. Thus, hydrogen generator 25a can generate and output additive at a desired flow rate and pressure for introduction into the gas flow stream flowing into the abatement apparatus 12. It should be understood that the output of apparatus 12, with hydrogen generator 25a, can then be directed to any of the filters described below.

In the abatement of CVD waste gas stream containing TEOS, air or oxygen may be introduced into the abatement tube, for example, via inlet 22a. As noted above, the oxygen may be introduced by a hydrogen and oxygen generator. This added oxygen assists in the complete oxidation of TEOS to silicon dioxide solid particles formed within the plasma field.

In brief the type of additive reactive gas, or gases, depends on the specific CVD or Etch waste gas stream that is being treated. As mentioned, water vapor, hydrogen, and/or oxygen may be added in Etch waste gas abatement, and air or oxygen may be added in CVD waste gas abatement. The final byproducts of the abatement of CVD or Etch waste gas streams include permanent gases, such as nitrogen, unreacted oxygen, acid gases and solids such as silicon dioxide, titanium dioxide, tungsten oxides and other organic and inorganic polymers, as products of complex ionic reactions within the RF plasma reaction zone of the abatement tube.

Inlet or inlets 22a may introduce the additive gas or gases as the process gases are introduced into abatement apparatus before the excitation of the processes gases or while they are excited. The flow rate and pressure of the additive gases (e.g. hydrogen and oxygen) as noted may be controlled, for example, using control system 150 (described below). For example, in a CVD waste gas stream containing TEOS, air or oxygen may be introduced into the abatement tube, for example, via inlet 22a with CF2:O2 flow rate ratio in a range of 1:0.25 to 1:0.50 or greater. For example for Etch process gas streams, the ratio of CF4:H2:O2 could be in the range of 1:0.5:0.25 to 1:1:0.5 and other ratios depending on the RF power. As described above, the highest DRE of PFCs in this apparatus can be achieved using a 13.56 MHz RF power in the range of 1500 to 3500 Watts and optimally at 3000 Watts for stoichiometric ratios at vacuum at pressures of 100-to-1500 mTorr and optimally at 850 mTorr.

Thus, as described, hydrogen generator 25a can generate and output hydrogen at a desired flow rate and pressure for introduction into the gas flow stream flowing into the abatement apparatus 12. It should be understood that the output of apparatus 12, with hydrogen generator 25a (or hydrogen and oxygen generator), can then be directed to any of the filters described below.

The permanent gases and acid gases go through the vacuum pump with relative ease and with no negative impact on the pump internal structures. However, to avoid potential damage to the pump, the solid byproducts of the abatement process may be removed before they could enter the pump.

As noted above, system 10 may include a static filter apparatus 16 or 116 to remove the solid byproducts in the exhaust from the output from abatement apparatus 12 and hence under vacuum pressure from the pump. In one form, filter apparatus 16 (and filter apparatus 116) comprise a static fluid filter, which is suited for low to medium particles generated in abating typical Etch process waste gases. For details of filter apparatus 16 or filter apparatus 116 reference is made to FIGS. 6 and 7 and the corresponding description provided below.

Figure 4:
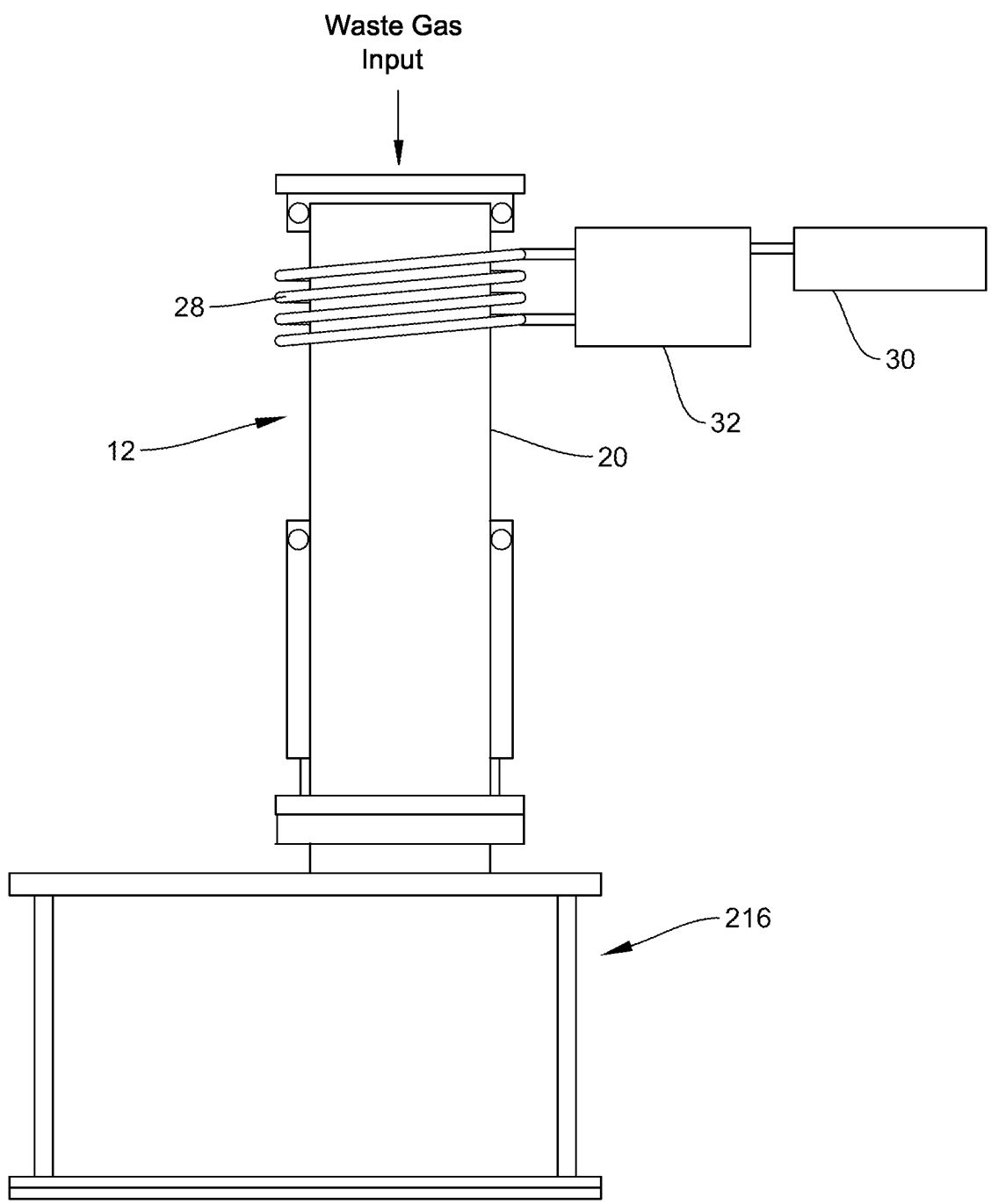
FIG. 4 is a partial fragmentary elevation view of a pre-pump abatement apparatus and of another embodiment of a fluid filter apparatus of the process waste abatement system of FIG. 1.

Referring to FIG. 4, a dynamic filter apparatus 216 may be used in combination with the abatement chamber described above, which may be more suitable for medium to high particles generated in abating typical CVD process waste gases where particle laden fluid needs to be removed automatically and often without interrupting the semiconductor processing system.

The abatement of waste gas streams of very high deposition rates CVD process could easily lead to very large particles generations within the RF abatement chamber. Such high particle generation could result in their attachment to the inner side of the abatement tube and if they agglomerate they could, after some running time, interfere with the RF plasma stability and ultimately plug the entire abatement tube.

Figure 5:
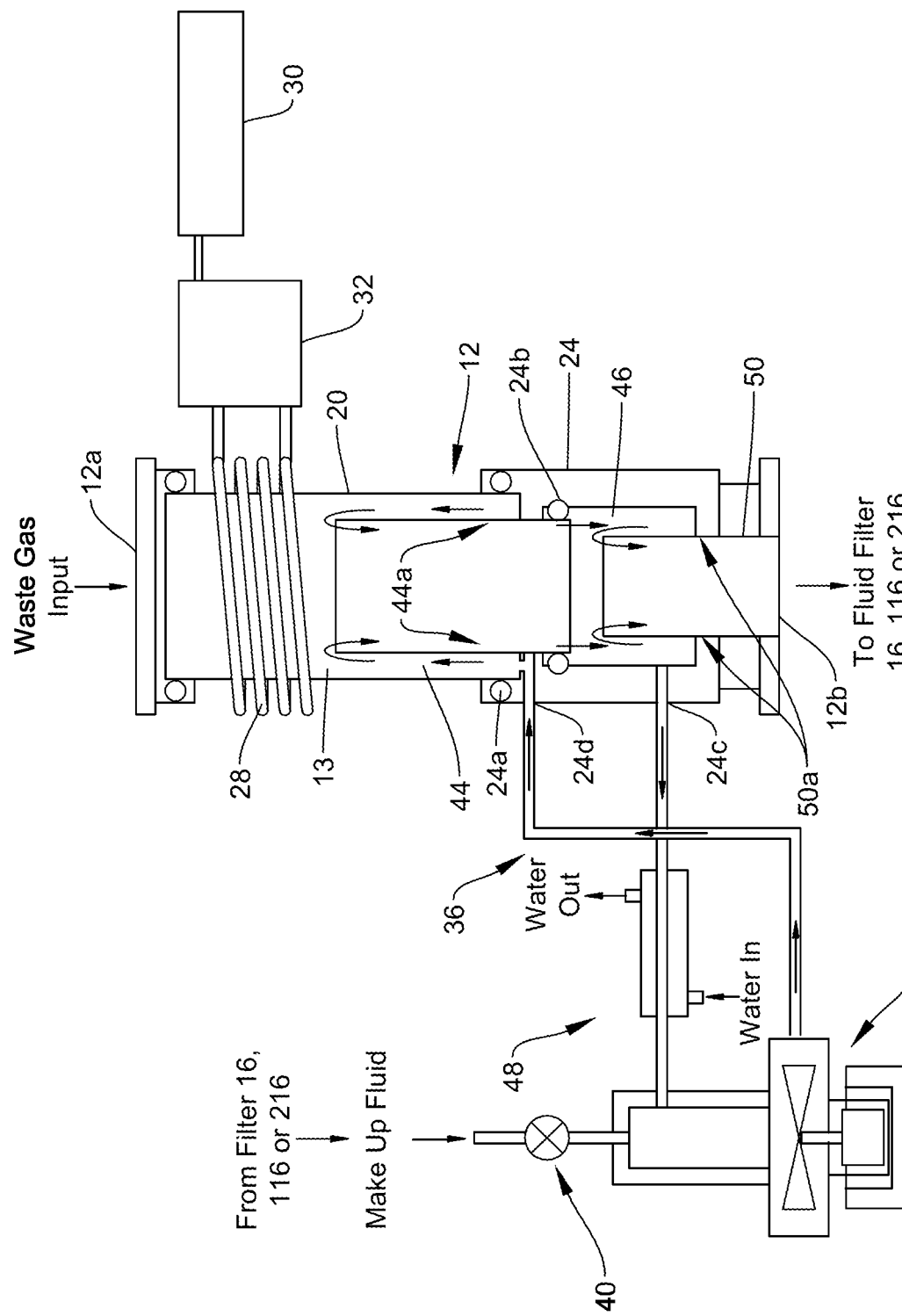
FIG. 5 is a schematic of another embodiment of a process waste abatement system for semiconductor processing.

Referring to FIG. 5, abatement chamber 13 may be configured with a cleaning apparatus, such as a fluid feeding circuit 36 that creates a moving film within a portion of the abatement tube 20 that reduces, if not prevents, the particles generated from reaching the inside of the abatement tube and further are optionally removed in a continuous or a periodic fashion. Further, the filter fluid that is used in the static or dynamic filters described below may be used as makeup fluid for the fluid feeing circuit. Referring to FIG. 5, makeup fluid may be injected into abatement chamber 13 through a valve 40 and pump 42 via fluid feeding circuit 36, so that fluid feeding circuit recirculated fluid from and to abatement chamber 13.

As best seen in FIG. 5, abatement apparatus 12 may include an inner tube 44 in chamber 13, which may be in line with inlet 12a and outlet 12b and which extends into base 24. Inner tube 44 is spaced inwardly of outer tube 20 and further inwardly of inlet 12a to provide space between inner tube 44 and outer tube as well as space beneath inlet 12a to allow fluid to be recirculated in abatement apparatus 12, as more fully described below.

Base 24 may also be configured with a fluid chamber 46, which is sealed against inner tube 44 by one or more seals 24b, such as o-ring seals, but in fluid communication with the abatement chamber 13 via the outlet of inner tube 44. Fluid chamber 46 is also in fluid communication with fluid feeding circuit 36 via an outlet 24c in base 24, which circulates fluid, and optionally make up fluid, through abatement apparatus 12 from outlet 24c and then back into abatement apparatus 12 at base 24 via inlet 24d. As noted, by circulating fluid through abatement chamber 13, particles that may otherwise adhere to the inside of tube 20 may be dislodged and exhausted to the filters described herein.

The fluid feeding circuit 36 includes conduits, such as tubes, that couple to the respective inlet and outlet of base 24 and to a pump 42 so that fluid can be flowed into base 24 under pressure (vacuum pressure) via inlet 24d between the inside surface of tube 20 and outside surface of inner tube 44 and, further, into the inlet of inner tube 44. Pump 42 may comprise a centrifugal pump, positive displacement pump, rotary vane pump, diaphragm pump, gear pump, piston pump, or screw pump, or other types of pumps that can have a magnetically coupled motor drive. The selected pump pumps the fluid under vacuum to the channel created between the outer tube 20 and the inner tube 44 as shown. The pumped fluid rises as shown by the upward arrows and flows over the top edge (at its inlet) of the inner tube 44 and wets the inner wall surface area 44a of the inner tube 44, removing any attached particles downwards. This fluid is then collected in fluid chamber 46, which as noted is formed in base 24, and in fluid communication with the tube 20 via inner tube 44 as shown.

The fluid in the fluid chamber 46, which is in fluid communication with the intake of the pump 42, is then also flowed through a heat exchanger 48 on the intake side of the fluid feeding circuit 36 so that heat is then removed from the flowing fluid by the heat exchanger 48, which removes heat absorbed from the heat of reactions and the RF plasma energy. The fluid may then be mixed with any makeup fluid introduced through valve 40 and recirculated back to abatement chamber 13 through the pump 42 and inlet 24*d* of base 24 into fluid chamber 46. Makeup fluid may be added occasionally depending on the particle loading of the circulating fluid.

The circulated fluid (along with any added makeup fluid) then displaces any extra fluid in the fluid chamber 46, which then flows down the inner wetted wall surface area 50*a* of a second inner tube 50, which is located in base 24 and forms the outlet 12*b* of abatement apparatus 12 for exhaust into the static or dynamic filters 16 or 116 or 216. Second inner tube 50 may also be in line with the first inner tube 44, inlet 12*a*, and outlet 12*b* abatement apparatus 12.

The height of the first inner tube 44 with respect to the location of the RF coil can vary and is determined and optimized for each CVD or Etch process. In the illustrated embodiment, the top of the first inner tube is below the last or lowermost loop of the coil 28. This continuous wetted wall particle removal method under vacuum is suitable for commercial use in vacuum fore-lines in both CVD and Etch processing, and other industrial applications.

Figure 5A:
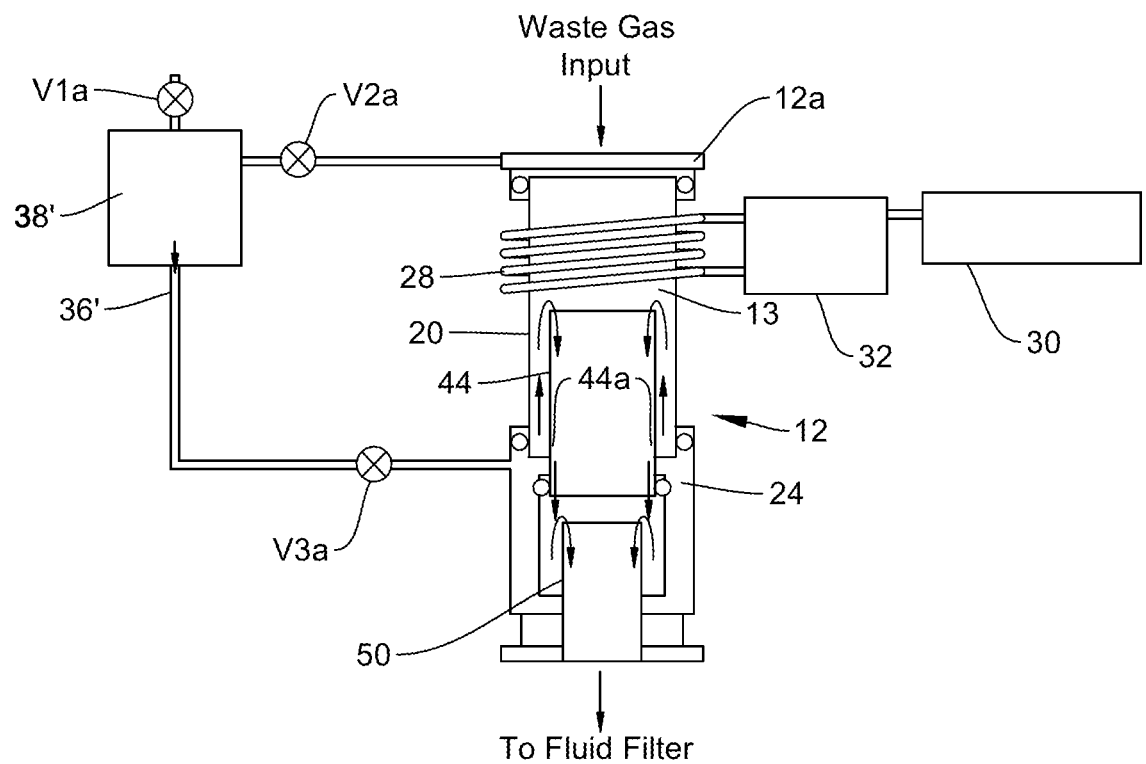
FIG. 5A is a schematic of yet another embodiment of a process waste abatement system for semiconductor processing.

The fluid can also be introduced or flowed into the abatement tube 20 without recirculating the fluid from and to the abatement chamber, as shown in FIG. 5*a*. In the illustrated embodiment, the abatement apparatus 12 is coupled to a fluid feeding circuit 36'. The fluid-feeding circuit 36' includes a fluid chamber or vessel 38' in selective fluid communication with an external supply of fluid, such as a holding tank that holds fluid at one atmosphere, which receives fluid (makeup fluid) from the external source (maintained at one atmosphere), then holds and dispenses makeup fluid to be flowed into abatement chamber 13. Fluid feeding circuit 36' is controlled by a plurality of valves V1A, V2A, and V3A as described below.

The makeup fluid vessel 38' is first evacuated when valves V1A and V3A are closed and valve V2A is opened. The opened valve V2A connects the makeup fluid vessel 38' to the abatement chamber 13 which is under vacuum. Once the makeup fluid vessel is completely evacuated, Valve V1A is opened for a set amount of time to allow a certain amount of fluid to be withdrawn from the external fluid source into the makeup fluid vessel 38'. Valve V1A is then closed and while Valve V2A is still open valve V3A is opened to allow a certain amount of fluid to be introduced under the force of gravity from fluid chamber 38' into the abatement chamber 13 (in tube 20) to wet the inner wall surface 44*a* of tube 44. This cycle is then repeated periodically and controlled by a control system with a microprocessor, which can be separate from or comprise the control system 150, described below.

The flow rate of the fluid introduced into abatement chamber 13 is determined by height of the fluid chamber 38' and of the wall of tube 44. This approach may be suitable in creating a continuous wetted wall (in tube 44) for particles removal under vacuum.

Figure 6:
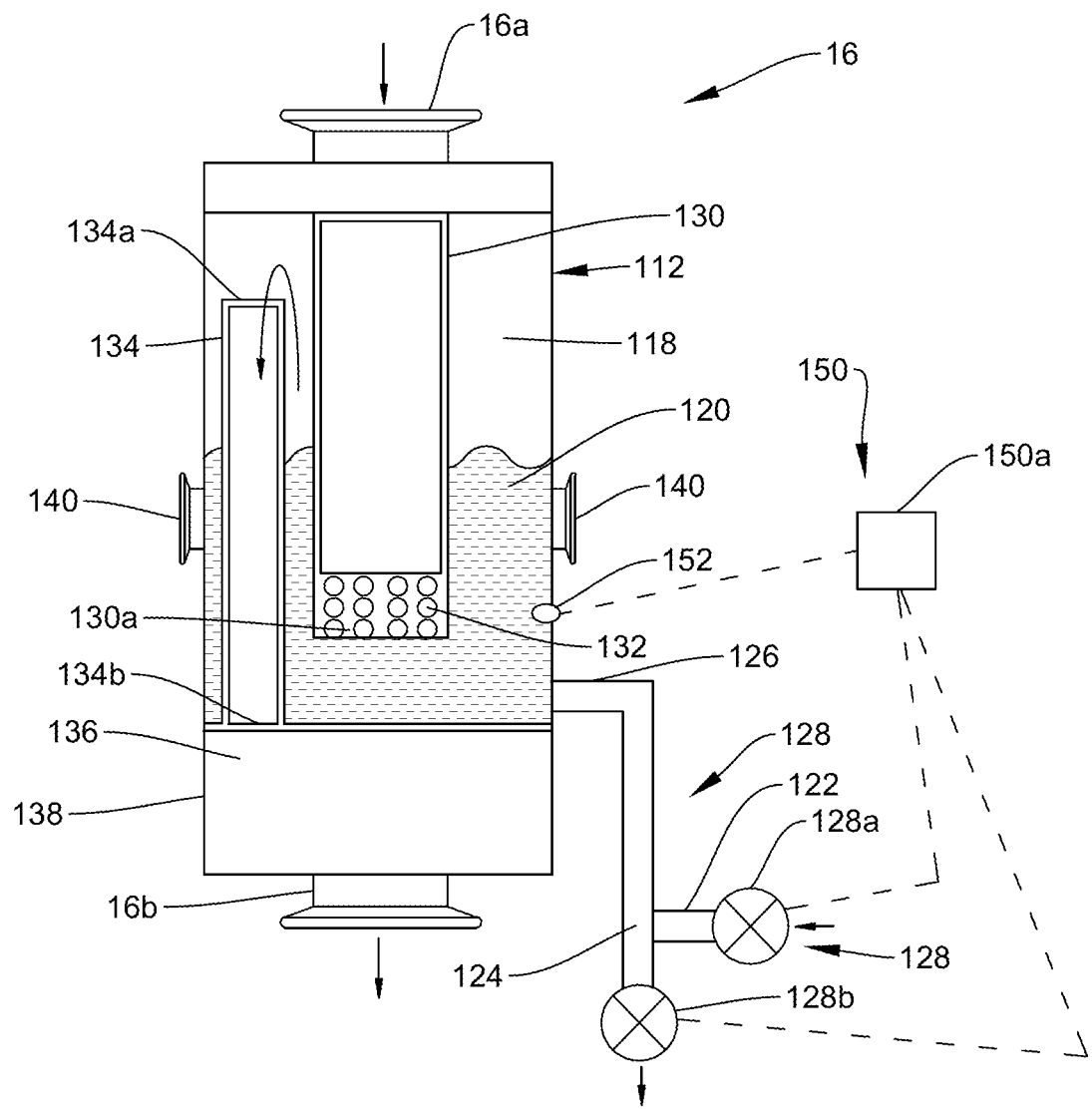
FIG. 6 is an enlarged schematic drawing of one embodiment of the filter apparatus of the abatement system of FIG. 1.

As noted above, abatement system 10 may include a filter apparatus 16 or 116. Referring to FIG. 6, filter apparatus 16 includes a housing 112 with a process gas inlet 114 for receiving the waste process gas inflow from abatement apparatus 12, which is typically laden with solids or particles, and a gas outlet 16*b* which is in fluid communication with a vacuum pump into which the filter discharges the filtered process gas after the filtering process described below.

Housing 112 is formed form an inert material, such as aluminum, quartz, polymers and typically a stainless steel alloy and includes a filter chamber 118 that receives the process gas from a semiconductor processing chamber through inlet 16*a* and from which filtered gas is discharged through outlet 16*b*. Filter chamber 118 forms a liquid reservoir 120 to hold a filter liquid that filters solids or particles from the process gas flowing into the filter apparatus. It has been found that suitable filter liquids to remove or filter out solids or particles from semiconductor process gases but which do not create chemical reactions with the reactants in the process gas stream include liquids with a vapor pressure below approximately $10^{-7}$ Torr and that are chemically inert. Suitable liquids include liquids that can be used in temperatures ranging from −58 degrees centigrade and up to +257 degrees centigrade and that have negligible outgassing. Suitable liquids include liquids that are electrically non-conductive with a dielectric strength of in a range of 15.7 MV/m. In addition, suitable liquids have kinematic viscosities greater than water (for reference, water has a kinematic viscosity of 1 cSt), for example, kinematic viscosities ranging from 38 to 1830 cSt. For example, suitable liquids include the commercially available Fomblin liquid, or perfluoropolyethers (PFPE). PFPEs have a vapor pressures of approximately $6\times10^{-8}$ Torr or below, and are chemically inert. PFPEs can be used in temperatures ranging from −58 degrees centigrade and up to +257 degrees centigrade and have negligible outgassing. PFPEs have a dielectric strength of approximately 15.7 MV/m, are chemically inert, and can be used in temperatures ranging from −58 degrees centigrade and up to +257 degrees centigrade and have negligible outgassing. They can be formulated with kinematic viscosities, for example, ranging from 38 to 1830 cSt. However, PFPE are expensive liquids and thus the particle-laden PFPE liquids withdrawn may be sent to commercial purifiers and recycled.

As will be more fully described below, the level of the liquid in the liquid reservoir 120 may be maintained by a control system to assure immersion of the process gas in the filter liquid, as described more fully below. For example, the height of the liquid in reservoir 120 may fall in a range of 3 inches to 8 inches, or 1 inch to 3 inches, or typically 2 inches to 6 inches depending on the configuration of the filter apparatus. The filter size and PFPE volume hold up varies depending on the specific semiconductor process and chemistry.

The filter liquid is delivered to and discharged from liquid reservoir 120 through a filter liquid inlet 122 and a filter liquid outlet 124, which are in communication with the liquid reservoir through conduits, such as tubing, that couple to a common port 126 on housing 112 for delivering and removing filter fluid to and from the liquid reservoir, respectively. Further, as will be more fully described below, the filter liquid may be circulated through the filter apparatus 16 to increase the interaction between the filter liquid and the process gas.

Referring again to FIG. 6, filter apparatus 16 further includes a feed tube 130, which is in communication with inlet 16*a* and extends into the filter liquid in the liquid reservoir 120 to directly inject the process gas flowing through the process gas inlet into the filter liquid in the liquid reservoir.

Feed tube 130 is formed from an inert material, such as aluminum, quartz, polymers and typically a stainless steel alloy and optionally includes a plurality of perforations 132 at its distal end portion 130*a*, with its distal end being closed to direct all the flow of the process gas through the perforations, which generate a bubbling effect with the process gas in the liter fluid. The size and number and locations of the perforations may vary, but may fall in a range of 0.125 inch in diameter to 0.5 inch or larger, or about 0.25 inch diameter. The purpose of the holes is to efficiently disperse the particle-laden gas stream and intimately mix it with the filter liquid. The gas bubbles created by the gas flowing from the perforations mixes with the filter liquid, and the particles are separated from the gas stream and adsorbed into the filter liquid without imparting any harmful back-streaming to the semiconductor processing chamber.

As noted above, abatement system 10 may include a control system 150 for controlling various valves in system 10, including the valves that control the filter liquid flow into and out of the liquid reservoir 120. For example, the control system 150 may include a controller 150a, such as a microprocessor, and a fluid circuit 128, with the controller 150a controlling the fluid circuit via electrically controlled valves 128a, 128b and a pump (not shown, such as a centrifugal or magnetically couple pump), to regulate the flow of filter liquid thorough inlet 122 and outlet 124 and into and out of the liquid reservoir 120. Control system 150 may also be configured to maintain the filter liquid at a liquid height in the liquid reservoir, as noted above. In this manner, the filter liquid may be exchanged with new filter liquid when the liquid is "spent" meaning that it has reached a certain level of absorption. For example, when the filter liquid is empirically deemed saturated with particles, it may be desirable to circulate fresh filter liquid in to the reservoir or it may be desirable to circulate the fluid regardless of how much it has absorbed of the particles.

In one embodiment, the control system 150 includes one or more sensors 152. Sensors 152 may be used to detect the level of the filter liquid or measure the opacity or other characteristic of the liquid, which may be used to indicate that the liquid has reached a certain level of particle absorption. For example, determining when the liquid has reached a certain level of particle absorption may be based on another characteristic of the liquid, such as the viscosity. Or both types of sensors may be used—one measuring the filter liquid height and the other measuring the characteristic of the liquid to indicate when the liquid has reached a desired level of particle absorption. In either or both cases, the control system 150 may be used to adjust the flow of filter fluid into and out of liquid reservoir 120 based on the one or more sensors to accommodate the output of the semiconductor chamber and/or to optimize the filtering process.

Optionally, filter apparatus 16 may include one or more optical windows 140 for viewing the chamber 118. For example, the widows or window 140 may be formed from PYREX or a quartz material and extend into and through the wall of housing 112. Windows 140 may be located beneath the desired filter liquid height so that the liquid can be observed manually for its height and/or opacity or other characteristic to offer manual control over the filter apparatus if desired. Windows 140 may comprise manual or automated optical windows and can be used to assess empirically the entrained solid content within the filter liquid and trigger a manual or automatic withdrawal of certain liquid volume and the addition of fresh filter liquid via valve 128a, 128b for continuous dynamic filter operation without the interruption of the process chamber or production. For example, the valving (e.g. valves 128a, 128b) noted above may provide manual control, including manual override control, over the electrically operated valves so that an operator may manually control filter apparatus 16.

In one embodiment, process gas inlet 16a and gas outlet 16b may be located at the top and side of housing 112 so that they have a generally ninety degree (right angle) orientation; however, they may be in line as shown and as shown and described in reference to the second embodiment.

In operation, the process gas flow enters at the top of filter apparatus 16, as shown, and goes through feed tube 130, bubbles through the filter liquid in reservoir 120, where sheds off its particles and leaves the filter liquid reservoir 120. The filtered gas then exits filter apparatus 16 through gas outlet 16b.

Referring again to FIG. 6, housing 112 may also include an exhaust chamber 138 between liquid reservoir 120 and gas outlet 16b to allow the filter gas to be exhausted from the filter chamber internally prior to being discharged through gas outlet 16b. With this configuration, the inlet 16a and outlet 16b may be in-line. Alternately, as noted, the exhaust chamber 138 may be omitted so that inlet 16a and outlet 16b have a right-angle filter arrangement.

To form exhaust chamber 138, housing 112 includes a solid plate 136 that divides in the internal space in housing 112 between filter chamber 118 and exhaust chamber 138 and further includes an internal conduit 134, which includes a first open end 134a located above the height of the filter liquid and a second open end 134b, which is extended through plate 136 for discharge into exhaust chamber 138. Although illustrated as terminating at plate 136, it should be understood that internal conduit 134 may extend through the plate into the exhaust chamber 138. A suitable conduit includes a tube or tubing that is formed from an inert material, such as aluminum, quartz, polymers and typically a stainless steel alloy.

As noted above, when process gas or gases flow into inlet 16a and are injected into the filter liquid in reservoir 120 via feed tube 130, due to the presence of the perforations in the feed tube 130, the process gas (gases) is bubbled into the filter liquid, where the solids or particles are removed from the process gas as they are absorbed by the filter liquid. The filtered gas is then exhausted from the filter chamber 118 through internal conduit 134, which directs the filtered gas into exhaust chamber 138, which then discharges the filtered gas through gas outlet 16b.

As stated above, in operation, the particle-laden process gas flow enters at the top of filter apparatus 16, as shown, and goes through the internal feed tube 130, bubbles through the filter apparatus in reservoir 120, and enters the internal conduit 134 after it is filtered and sheds off its particles and leaves the filter liquid reservoir 120. The filtered gas then enters exhaust chamber 138 and exits filter apparatus 16 at the bottom and in in-line with the top process gas inlet.

In another embodiment of this liquid filter, the gas flow enters filter apparatus 16 and the liquid level is set above the bottom of the tube, for example at a fraction of an inch within the tube, but the tube has no perforations 132. The gas molecules diffuse through the small hydraulic head of the fluid and the particles are collected by the fluid.

In another embodiment of this liquid filter, the gas flow enters filter apparatus 16 and the liquid level is below the tube, for example at a fraction of an inch below the tube. In such embodiment, the permanent waste gas that is under high vacuum turns upwards and the particles are separated as there is no gas drag force on these particles. The particles are then collected by the liquid and the gas flows through exit tube 134.

Figure 7:
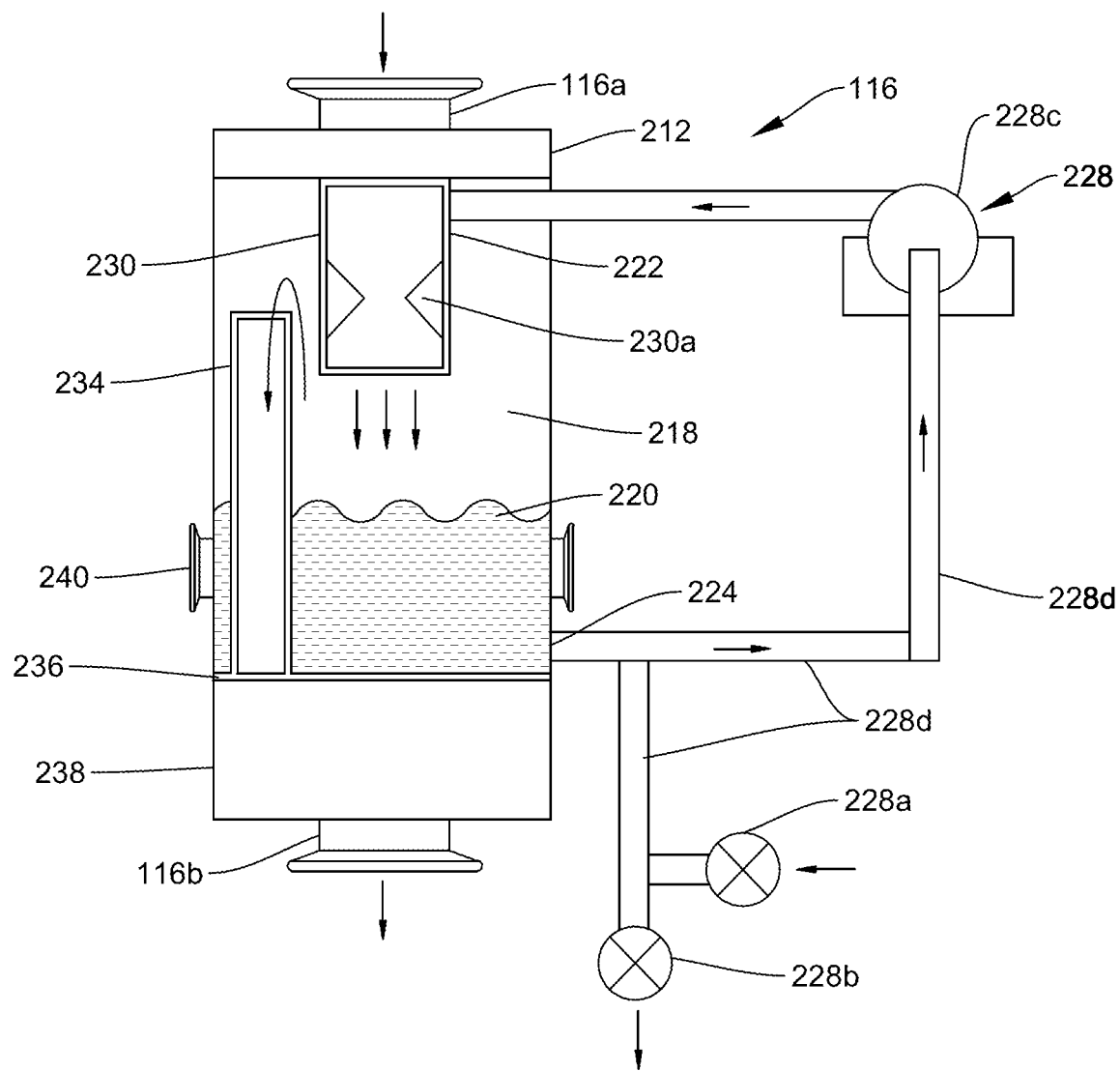
FIG. 7 is an enlarged schematic drawing of another embodiment of the filter apparatus of the abatement system of FIG. 1.

Referring to FIG. 7, filter apparatus 116 is also configured to filter solids or particles from the semiconductor process gas, which is exhausted from the abatement chamber of the abatement apparatus 12. Similar to the previous embodiment, filter apparatus 116 includes a housing 212 with a process gas inlet 116a for receiving the semiconductor process gas inflow from abatement apparatus 12, which is typically laden with solids or particles, and a gas outlet 116b, which discharges the filtered process gas after the filtering process described above. For details of the suitable materials for the housing construction reference is made to the above embodiment.

As best seen in FIG. 7, housing 212 also includes a filter chamber 218 that receives the process gas through process gas inlet 116a and from which the filtered gas is discharged through gas outlet 116b. Filter chamber 218 forms a liquid reservoir 220 to hold a filter liquid that filters solids or particles from the process gas flowing into the filter apparatus. For examples of suitable liquid characteristics and suitable liquids that can filter solids or particles from semiconductor process gases, reference is made to the first embodiment.

In the illustrated embodiment, process gas inlet 116a and gas outlet 116b are generally in line similar to the above embodiment. To that end, housing 220 may also include an exhaust chamber 238 between liquid reservoir 220 and gas outlet 116b to allow the filter gas to be exhausted from the filter chamber internally prior to being discharged through gas outlet 116b. For further details of exhaust chamber 238 reference is made to the previous embodiment.

Similar to the previous embodiment, housing 210 includes a feed tube 230 that is in fluid communication with inlet 116a but extends into chamber 218 and optionally terminates above the filter fluid. Tube 230 is also formed from an inert material, such as aluminum, quartz, polymers and typically a stainless steel alloy In the illustrated embodiment, tube 230 includes a restriction 230a to form a venturi tube and an inlet 222 for the filter fluid to flow into the tube 230 and to generate the pressure differential to draw in the process gas into tube 230 through inlet 222 where it mixes with the filter liquid and thereafter is discharged into the filter chamber 218 via tube 230. The filter liquid is also discharged into the liquid reservoir 220 from tube 230.

In a similar manner as described above, the filter fluid may be circulated through apparatus 210 by way of a fluid circuit 228 (e.g. controlled by a controller, such as described above, which includes, in addition to valves 228a and 228b, a pump 228c (such as a centrifugal or magnetically coupled pump), which circulates the filter fluid though apparatus 210 by way of various conduits 228d.

In the illustrated embodiment, as noted, the liquid inlet 222 is formed in the tube 230, while the liquid outlet 224 is located in the liquid reservoir beneath the liquid level.

Filter apparatus 116 operates in a similar manner to filter apparatus 16. Process gases flows into inlet 116a but whose flow is enhanced by the venturi effect of the filter liquid flowing through tube 230. The process gas mixes with the filter liquid and is then filtered and injected into the filter chamber 218 via feed tube 230. The filtered gas is then exhausted from the filter chamber 218 through internal conduit 234, which directs the filtered gas into exhaust chamber 238, which then discharges the filtered gas through gas outlet 116b.

In a similar manner to the previous embodiment, the filter liquid may be circulated through the apparatus 210 via a fluid circuit 228, which as noted includes an inlet valve 228a (which is in fluid communication with liquid inlet 222), an outlet valve 228b (which in fluid communication with liquid outlet 224), and various conduits to direct the flow of filter liquid trough apparatus 210. Fluid circuit 228 may also be configured to replace the filter liquid after a given time period or after the filter liquid has reached a desired level of particle saturation, as described above.

Filter apparatus 116 may also include optical windows 240 for viewing the chamber 218, similar to the previous embodiment.

Figure 8:
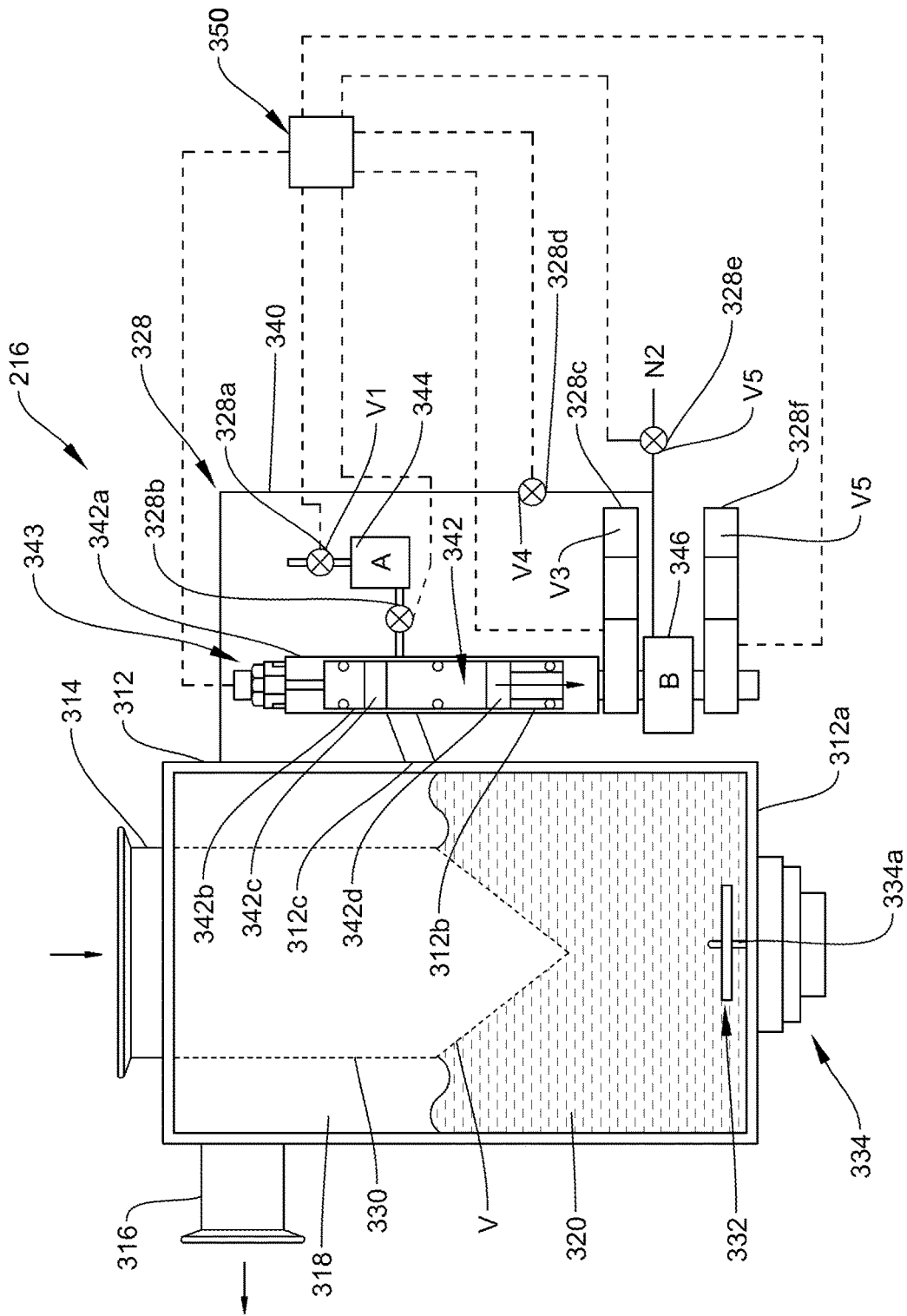
FIG. 8 is an enlarged schematic drawing of another embodiment of the filter apparatus of the abatement system of FIG. 1.

Referring to FIG. 8, similar to the previous filters, filter apparatus 216 is configured to filter solids or particles from the semiconductor process gas (gases), which is exhausted from the semiconductor process chamber. Further, as will be more fully described below, liquid filter apparatus 216 is configured to be in communication with a fluid circuit (328, described below) in an arrangement that allows for automatic fluid addition and removal of filter fluid to or from chamber (318) of the fluid apparatus.

Similar to the previous embodiment, filter apparatus 216 includes a housing 312, which forms a filter chamber 318, with a process gas inlet 314 for receiving the semiconductor process gas inflow from a semiconductor processing chamber into chamber 318 (see FIG. 1 for example, where filter apparatus 216 is mounted in the fore-line of the processing system, between the semiconductor chamber and the process pump), which is typically laden with solids or particles, and a gas outlet 316, which discharges the filtered process gas from chamber 318 after the filtering process described below. For details of the suitable materials for the housing construction reference is made to the first embodiment.

As best seen in FIG. 8, chamber 318 forms a liquid reservoir 320 to hold a filter liquid that filters solids or particles from the process gas flowing into the filter apparatus, and which is then discharged as waste. For examples of suitable liquid characteristics and suitable liquids that can filter solids or particles from semiconductor process gases, reference is made to the first embodiment. In the illustrated embodiment, process gas inlet 314 and gas outlet 316 have a right angle arrangement. Similar to the previous embodiment, housing 312 includes a feed tube 330 that is in fluid communication with inlet 314 and that extends into chamber 318 and optionally terminates at or slightly below the filter fluid in liquid reservoir 320. Tube 330 is also formed from an inert material, such as aluminum, quartz, polymers and typically a stainless steel alloy.

In the illustrated embodiment, chamber 318 includes a rotating member 332, which is driven to rotate by a motor 334, which may be controlled by control system 150. Motor 334 is mounted external or outside of housing 312 but whose drive shaft 334a may extend through a sealed opening provided in housing wall 312a to engage rotating member 332 or may not penetrate the housing an instead couple to the rotating member via a magnetic coupling, as noted below. For example, the sealed opening may be formed by a sealed bushing or sealed grommet. The rotating member 332 may be in the form of multiple blades commonly mounted to an annular support, which is rotatably mounted at the bottom portion of housing wall 312a.

In one embodiment, drive shaft 334a of motor couples to rotating member 332 by a magnetic coupling through the wall of the housing 312. For example, shaft 334a may include a magnet, and rotating member 332 may also include a magnet, for example, mounted in or about the annular support to provide the magnetic coupling.

As noted above, rotating member 332 is located at the bottom portion of housing 312 in liquid reservoir 320 and, when rotated by motor 334, stirs or rotates the filter fluid in liquid reservoir 320, optionally in a continuous fashion. This fluid rotation enables the particles of varying densities to thoroughly mix with the filter fluid and thereafter is discharged from the filter chamber 318 via an outlet 312b formed in housing wall 312a. In addition, the rate of rotation will impact the discharge rate of the fluid from chamber via outlet 312b and the rate of inflow of the filter fluid into chamber 318 via an inlet 312c (also formed in housing wall 312a) from the fluid circuit described below. Further, the rate of rotation will determine the depth of the vortex V generated due to fluid rotation.

In a similar manner as described above, the filter fluid may be selectively and automatically circulated through filter apparatus 216 by way of a fluid circuit 328 (e.g. controlled by control system 150 or another controller, such as programmable logic controller, including microprocessor, such as described below).

In the illustrated embodiment, fluid circuit 328 includes a conduit 340, which is in fluid communication with the chamber 318 above the filter fluid, a sliding valve 342, and a plurality of control valves 328a (V1), 328b (V2), 328c (V3), 328d (V4), 328e (V5), and 328f (V6), which are opened and closed by a controller 350 (such as a microprocessor or by the controller of control system 150), to automatically control the flow of fluid through conduit 340 and through valve 342 based on a sequence of valve openings and closings described below. By providing fluid communication between chamber 318 (above the filter fluid) and conduit 340, conduit 340 is subject to the pressure in chamber 318, which is under a vacuum (or low or very low pressure) due to the fluid communication between the fore-line and chamber 318 through outlet 316. This vacuum (or low or very low pressure) is then extended to other parts of circuit 328, as described below. For example, conduit 340 may comprise a stainless steel tube.

As best seen in FIG. 5, sliding valve 342 includes a cylinder 342a and a sliding piston 342b, which is moved up and down cylinder 342a (as viewed in FIG. 8) by a motor 343, which is also controlled by controller 350 (or optionally control system 150) to open and close communication with the chamber 318 and circuit 328 through valve 342.

Additionally, circuit 328 includes two chambers 344 and 346, with chamber 344 in selective fluid communication with a make-up fluid supply via valve 328a (V1), and with chamber 346 in selective fluid communication with a supply of nitrogen gas via valve 328c (V3) and via valve 328e (V5) with conduit 340. Thus, when valve 328a (V1) is opened, chamber 344 is filled with make-up fluid. Similarly, when valve 328e (V5) is opened, chamber 346 is filled with nitrogen. When valve 328e (V5) is closed, and valve 328d (V4) is open, the pressure in chamber 346 is then reduced to a low, very low or vacuum pressure.

To control the flow of fluid into and out of reservoir 320, cylinder 342a includes a first port (optionally formed by a conduit) in fluid communication with inlet 312c of housing 312 and a second port (optionally formed by a conduit) in fluid communication with outlet 312b of housing 312. Further, piston 342b includes two transverse passageways 342c and 342d, which when moved by motor 343 can align with the ports of the cylinder 342a to allow fluid communication between reservoir 320 and chamber 344 and/or chamber 346, depending on the open or closed state of valve 328b (V2) and valve 328c (V3). Valve 328b (V2) provides for selective fluid communication between chamber 344 and sliding valve 342 and reservoir 320 depending on the position of the piston 342b, and valve 328c (V3) provides for selective fluid communication between chamber 346 and sliding valve 342 and reservoir 320 depending on the position of the piston 342b.

As best understood from FIG. 8, when valve 328a (V1) is open and all the other valves (328b (V2), 328c (V3), 328d (V4), 328e (V5), and 328f (V6)) are closed (e.g., step 1), make-up fluid is directed to chamber 344. When valve 328b (V2) and valve 328c (V3) are open and the rest of the valves (328a (V1), 328d (V4), 328e (V5), and 328f (V6)) are closed (e.g., step 2) and motor 343 is driven to move the piston in the lower position (as viewed in FIG. 8, where the transverse passageways 342c and 342d of piston 342b are aligned with the ports of the cylinder 342a), make-up fluid is sent to reservoir 320 and particle-filled fluid is discharged to chamber 346. When valves 328a (V1), 328b (V2), 328c (V3), and 328d (V4) are closed and valves 328f (V6) and 328e (V5) are opened (e.g., step 3) then fluid is removed from chamber 346, driven by a pre-set nitrogen flow passing through the open valve 328e (V5). Once a given time is allowed so the fluid is removed from chamber 346, then valves 328a (V1), 328b (V2), 328c (V3), and 328e (V5), and 328f (V6) are closed and valve is 328d (V4) is opened to allow chamber 346 to evacuate so that the pressure in chamber 346 equilibrates with the fore-line pressure (e.g., step 4). And the sequence is repeated by the controller. The timing of the sequence steps can vary because it is based the particular process and settings for the process. On average it is anticipated that the sequence timing could be cycling every 10 to 20 seconds depending on the particle loading of the fluid. If the semiconductor process effluent is of low particle loading the sequence could be up to 30 to 60 minutes.

Filter apparatus 216 operates in a similar manner to filter apparatus 16 or 116 in that process gases flows into inlet 314 but whose flow is then enhanced by the vortex effect of the filter liquid flowing around tube 330. The process gas mixes with the filter liquid and is then filtered after it is injected into the filter chamber 318 via feed tube 330. The filtered gas is then exhausted from the filter chamber 318 through gas outlet 316.

In the illustrated embodiment, the filter liquid is thus dynamically circulated through the filter apparatus 216 via fluid circuit 328.

Fluid circuit 328 may also be configured to replace the filter liquid after a given time period or after the filter liquid has reached a desired level of particle saturation, as described above.

Referring to FIG. 1, as noted, filter apparatus 216 may be installed in the fore-line between a semiconductor processing chamber and a processing pump, and further installed in a system with multiple chambers and multiple pumps, with the waste fluid from each of the filter apparatuses optionally directed to a shared waste tank, and optionally with the make-up fluid supplied from a shared make-up fluid supply tank.

In any of the embodiments, the control system may include one or more sensors (not shown in each embodiment), which may be used to detect the level of the filter liquid or measure the opacity (optical torpidity) or other characteristic of the liquid, which may be used to indicated that the liquid has reached a certain level of absorption. Or both types of sensors may be used—one measuring the filter liquid height and the other measuring the characteristic of the liquid. In either or both cases, the control system may be used to adjust the flow of filter fluid into and out of the apparatus based on the one or more sensors to accommodate the output of the semiconductor chamber and/or to optimize the filtering process.

Both the right angle and the in-line filter apparatus configurations may be passive ("passive" means the reservoir has a fixed amount of filter fluid that is periodically manually change and replace with new filter fluid), i.e. they are inserted in line in a semiconductor processing system using the process gas pressure and flow characteristics of the semiconductor processing system or dynamic ("dynamic" means the particle laden filter fluid is dynamically/automatically removed and exchanged with fresh filter fluid, as described above in reference to FIG. 8). As noted, the filter liquids may be removed and added periodically through the valving and optionally pump based on predetermined maintenance periods. As noted, in one configuration, a filter liquid recirculating pump may be added to recirculate the filter liquid. In this embodiment, the recirculating filter liquid can have very high recirculating flow rate and may be mixed more efficiently using the venturi tube as shown and described. Using a venturi tube may achieve very high particle/gas separation and, as noted, creates a localized vacuum pull on the process gases entering the filter apparatus thus assisting the process vacuum pump operation and potentially reducing its total energy consumption.

For further details of suitable filters that may be used reference is made to copending application entitled LIQUID FILTER APPARATUS FOR GAS/SOLID SEPARATION FOR SEMICONDUCTOR PROCESSES, U.S. patent Ser. No. 16/893,504, filed on Jun. 5, 2020, which is hereby incorporated by reference in its entirety.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular. Any reference to claim elements as "at least one of X, Y and Z" is meant to include any one of X, Y or Z individually, and any combination of X, Y and Z, for example, X, Y, Z; X, Y; X, Z; and Y, Z.

I claim:

1. A semiconductor waste abatement system for a semiconductor processing system, the semiconductor processing system having a semiconductor processing chamber having a waste gas outlet, said semiconductor waste abatement system comprising:
    a vacuum pump having a pump inlet and a pump outlet;
    an abatement apparatus having an abatement chamber including a waste gas inlet and an outlet, said waste gas inlet adapted for fluid communication with a source of semiconductor waste gas from the waste gas outlet of the semiconductor processing chamber, said abatement chamber including an outer tube having said waste gas inlet, said waste gas inlet of said outer tube being adapted for fluid communication with the waste gas outlet of the semiconductor processing chamber, said abatement chamber further having an inner tube spaced inwardly of said outer tube to define a space there between and inwardly of said waste gas inlet, said inner tube having an inner wall, an inlet, and an outlet, said outlet of said inner tube being adapted for fluid communication with said pump inlet of said vacuum pump wherein said abatement chamber is under a vacuum, and said abatement chamber being configured to ionize the semiconductor waste gas and to exhaust ionized gas in said outer tube at said output of said abatement apparatus;
    a filter apparatus including a filter chamber, an inlet, and an outlet, said filter chamber forming a liquid reservoir, and said inlet of said filter apparatus in fluid communication with said outlet of said abatement chamber and said liquid reservoir, and said outlet of said filter apparatus in communication with said vacuum pump inlet, wherein the filter chamber is under a vacuum, and wherein the semiconductor waste gas is ionized in said abatement chamber and then filtered by said filter apparatus prior to input to said vacuum pump; and
    a fluid feeding circuit flowing fluid to said space between said outer tube and said inner tube wherein the fluid flows to said inlet of said inner tube to wet the inner wall of the inner tube to remove particles that may be deposited on said inner wall when said semiconductor waste abatement apparatus is used to abate the semiconductor waste gas from the semiconductor processing chamber.

2. The semiconductor waste abatement system of claim 1, wherein said fluid feeding circuit is configured to recirculate fluid from said outlet of said inner tube to said space between said outer tube and said inner tube.

3. The semiconductor waste abatement system of claim 1, further comprising a coil adapted to generate an electromagnetic field to ionize the semiconductor waste gas into a plasma.

4. The semiconductor waste abatement system of claim 3, wherein said coil includes a plurality of loops, said inner tube spaced from a lowermost loop of said plurality of loops.

5. The semiconductor waste abatement system of claim 2, wherein said inner tube is a first inner tube, further comprising a second inner tube in fluid communication with first inner tube, said second inner tube having an inlet and forming or being adapted for fluid communication with said outlet of said abatement.

6. The semiconductor waste abatement system of claim 5, wherein said inlet of said second inner tube is spaced below said outlet of said first inner tube, and said fluid feeding circuit recirculates fluid from below said inlet of said second inner tube and flows the recirculated fluid into the space between the first inner tube and the outer tube below the inlet of the first inner tube under a vacuum.

7. The semiconductor waste abatement system according to claim 1, wherein said abatement apparatus is configured to ionize the semiconductor waste gas into a plasma under vacuum or to thermally treat the semiconductor waste gas using high temperature tungsten halogen lamps while the abatement apparatus is under vacuum.

8. The semiconductor waste abatement system according to claim 7, wherein said abatement apparatus is configured to generate an electromagnetic field to ionize the semiconductor waste gas into the plasma.

9. The semiconductor waste abatement system according to claim 7, wherein said filter apparatus further including a feed tube, said feed tube having a venturi restriction therein and a venturi inlet to draw in the process gas or filter liquid fluid into said filter apparatus, wherein said filter apparatus operates under a vacuum.

10. The semiconductor waste abatement system according to claim 9, wherein said feed tube comprises a perforated feed tube.

11. The semiconductor waste abatement system according claim 9, wherein said filter apparatus includes a filter liquid control system for controlling the filter fluid flow into and out of said liquid reservoir, and optionally said filter liquid control system is configured to maintain the filter fluid at a liquid height in said liquid reservoir.

12. The semiconductor waste abatement system according to claim 11, wherein said filter liquid control system includes a pump to pump the filter fluid into said liquid reservoir under a vacuum.

13. The semiconductor waste abatement system according to claim 9, wherein said filter chamber includes a rotating member to rotate the filter fluid in said filter chamber, wherein said filter chamber operates under a vacuum.

* * * * *

UNITED STATES PATENT AND TRADEMARK OFFICE
CERTIFICATE OF CORRECTION

PATENT NO. : 11,931,682 B2
APPLICATION NO. : 17/405270
DATED : March 19, 2024
INVENTOR(S) : Imad Mahawili It is certified that error appears in the above-identified patent and that said Letters Patent is hereby corrected as shown below:

In the Claims

Column 18
Claim 1, Line 24, "apparatus." should be --chamber.--
Claim 5, Line 58, "abatement." should be --abatement chamber.--

Column 19
Claim 9, Lines 12, delete "liquid"

Signed and Sealed this
Fourth Day of June, 2024

Katherine Kelly Vidal
*Director of the United States Patent and Trademark Office*